United States Patent
Girdhar et al.

(10) Patent No.: US 9,473,140 B2
(45) Date of Patent: Oct. 18, 2016

(54) SERIES ARRANGED MULTIPLEXERS SPECIFICATION SUPPORT ENABLEMENT CIRCUIT AND METHOD

(71) Applicant: Texas Instruments Incorporated, Dallas, TX (US)

(72) Inventors: Rajiv Girdhar, Rohtak (IN); Anubhav Shukla, Unnao (IN); Aishwarya Dubey, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 129 days.

(21) Appl. No.: 13/782,702

(22) Filed: Mar. 1, 2013

(65) Prior Publication Data
US 2014/0247084 A1    Sep. 4, 2014

(51) Int. Cl.
*G06F 3/00* (2006.01)
*H03K 19/0175* (2006.01)
*G06F 1/32* (2006.01)
*G06F 3/16* (2006.01)
*G06F 13/38* (2006.01)

(52) U.S. Cl.
CPC ..... *H03K 19/017509* (2013.01); *G06F 1/3203* (2013.01); *G06F 3/16* (2013.01); *G06F 13/385* (2013.01)

(58) Field of Classification Search
None
See application file for complete search history.

(56) References Cited

U.S. PATENT DOCUMENTS

| | | | | |
|---|---|---|---|---|
| 6,459,652 B1* | 10/2002 | Lee et al. | | 365/233.14 |
| 2003/0085747 A1* | 5/2003 | Hein et al. | | 327/269 |
| 2003/0226075 A1* | 12/2003 | Fallah | | G06F 17/5022 |
| | | | | 714/724 |
| 2003/0234667 A1* | 12/2003 | Digari et al. | | 326/39 |
| 2005/0005056 A1* | 1/2005 | Ware | | 711/1 |
| 2008/0318620 A1* | 12/2008 | van Waasen | | 455/552.1 |
| 2011/0314348 A1* | 12/2011 | Whetsel | | 714/729 |

* cited by examiner

*Primary Examiner* — Henry Tsai
*Assistant Examiner* — Aurangzeb Hassan
(74) *Attorney, Agent, or Firm* — Lawrence J. Bassuk; Frank D. Cimino

(57) ABSTRACT

Several circuits and methods that may be implemented to enable specification support of a plurality of interface components in an IC are disclosed. In an embodiment, a circuit includes a plurality of multiplexer circuits and a control circuit. The plurality of multiplexer circuits are configured to provide a plurality of data paths and a plurality of outputs according to a set of selection signals. The plurality of data paths is configurable for at least a first mode of operation or a second mode of operation based on the set of selection signals. The first mode of operation and the second mode of operation are associated with complimentary specifications. The control circuit is coupled with the plurality of multiplexer circuits in order to control the set of selection signals of the plurality of multiplexer circuits to thereby select one of the first mode and the second mode of operation.

2 Claims, 2 Drawing Sheets

SERIES ARRANGED MULTIPLEXERS SPECIFICATION SUPPORT ENABLEMENT CIRCUIT AND METHOD

TECHNICAL FIELD

The present disclosure generally relates to the field of specifications support enablement.

BACKGROUND

In accordance with an exemplary scenario, it is noted that, with the growing popularity of integrated circuits (ICs) in various electronic applications, such as central processing units (CPUs), application specific integrated circuit (ASICs), and the like, the performance and complexity of ICs have increased significantly. Indeed, one exemplary scenario provides that ICs are increasingly utilized for the development of dense, high-performance, IC based devices that may integrate all (or nearly all) of the components of a complex electronic system into a single chip. Such devices may be referred to as, for example, system-on-chip (SoC) devices.

Pursuant to one exemplary scenario, several systems-on-chip (SoCs) include provisions for interfacing with multiple circuits. Such SoCs may be integrated with elements such as memory circuits, display circuits, and the like, in order to provide a multitude of options to users. The SoCs may include, for example, a controller for connecting to this variety of components, wherein these components may be associated with different timing specifications for each of these options. Furthermore, the specifications of various components may conflict with one another, and meeting such conflicting timing specifications by the same controller may be difficult.

SUMMARY

This Summary is provided to introduce a selection of concepts in a simplified form that are further described below in the Detailed Description. This Summary is not intended to identify key or important features of the claimed subject matter, nor is it intended to be used as an aid in determining the scope of the claimed subject matter.

A number of exemplary circuits and methods, which may be implemented so as to enable specifications support of a plurality of interface components in an Integrated Circuit (IC), are disclosed. In an embodiment, a circuit is disclosed that includes a plurality of multiplexer circuits and a control circuit. The plurality of multiplexer circuits are configured to provide a plurality of data paths and a plurality of outputs according to a set of selection signals. The plurality of data paths are configurable for a mode of operation from among a first mode of operation and a second mode of operation based on the set of selection signals. The first and second modes of operation being associated with complimentary specifications. The control circuit is coupled with the plurality of multiplexer circuits, the control circuit configured to control the set of selection signals to thereby select the mode of operation from among the first and second modes of operation.

Additionally, in an embodiment, an IC configured to enable specifications support of a plurality of interface components is provided. The IC includes a logic unit, and an interface circuit. The logic unit is configured to perform logic operations associated with the plurality of interface components. The interface circuit is coupled with the logic unit and includes a plurality of multiplexer circuits and a control circuit. The plurality of multiplexer circuits are configured to provide a plurality of data paths and a plurality of outputs according to a set of selection signals. The plurality of data paths are configurable for a mode of operation from among a first mode of operation and a second mode of operation based on the set of selection signals. The first and second modes of operation being associated with complimentary specifications. The control circuit is coupled with the plurality of multiplexer circuits, the control circuit configured to control the set of selection signals to thereby select the mode of operation from among the first and second modes of operation.

Moreover in an embodiment, a specifications support enablement method is disclosed. In an embodiment, the method includes selecting a control circuit and a plurality of multiplexer circuits coupled with the control circuit. The method further includes receiving multi-bit data at the control unit. Furthermore, the method includes performing a selection of at least one selection signal from among a set of selection signals received by the plurality of multiplexer circuits. The selection is configured to provide a plurality of data paths and a plurality of outputs associated with the plurality of multiplexer circuits. The set of selection signals configured to control the plurality of multiplexer circuits so as to select a mode of operation from among a first mode of operation and a second mode of operation, and the first and second modes of operation being based on complimentary specifications.

Other aspects and exemplary embodiments are provided in the drawings and the detailed description that follow.

The drawings referred to in this description are not to be understood as being drawn to scale except if specifically noted, and such drawings are only exemplary in nature.

DETAILED DESCRIPTION

Pursuant to an exemplary scenario, systems on chip (SoCs) include multiple configurations for products/applications in a single design. For example, the SoCs comprise or include multiple components, such as, for example, a multimedia card, a display and peripheral components that may be accessed for utilizing various options in the SoCs. In an exemplary scenario, ICs comprising memory devices may be required to provide multiple input/output options on a single IC. Examples of multiple options may include a flexible rate at which data may be accessed with respect to a clock signal. It is noted that, in one example, the designs in which data is accessed once per clock cycle are termed as single data rate (SDR) type, while the designs accommodating the provisioning of data transfer twice per clock cycle are termed as double data rate (DDR) type designs. The DDR designs allow data transfer at the rising edge and the falling edge of the clock.

Various system components (or interfaces), such as a multimedia card, a display, and the like are required to be connected with various off-the-shelf components on customer ICs. For example, an MMC controller may be connected to a range of external multimedia cards (eMMCs) and secure digital (SD) cards based on user specifications. The voltage for such eMMC cards varies from, for example, 1.8V-3.3V, while the frequency specification varies from, for example, 24 mega-hertz (MHz)-SDR to 96 MHz-DDR. The timing specifications for these multiple options are different and may sometimes be conflicting. Meeting these conflicting timing specifications simultaneously on the same IC is extremely difficult. An example illustrating conflicting timing specifications of various options that are to be provided by a SoC is described in further detail herein with reference to FIG. 1.

Figure 1:
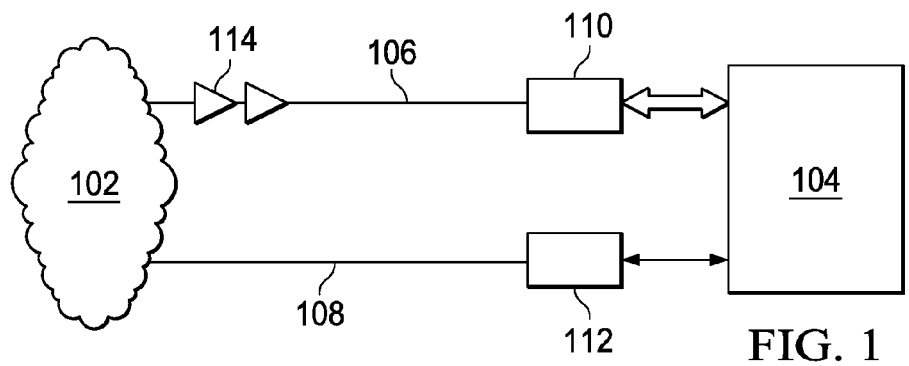
FIG. 1 illustrates an exemplary system for describing varying timing specifications of a plurality of interface components in an IC in accordance with an exemplary scenario.

FIG. 1 illustrates an exemplary system 100 configured to enable specifications support, such as, for example, for timing specifications of a plurality of interface components in an IC, in accordance with an exemplary scenario. The system 100 includes a logic unit 102 configured to be coupled with or connected to the plurality of interface components 104. The logic unit 102 is configured to perform logic operations associated with the plurality of interface components 104. The logic unit 102 is coupled with or connected to the plurality of interface components 104 through a data path, such as, for example, a data path 106. An example of the logic unit 102 may include a memory card, such as, for example, a MMC that may be configured to couple with a variety of system components, such as an eMMC card, an SD card, and the like. Also, based on various customer specifications, the voltage specifications of external SD cards may vary within a range of values, such as, for example, from 1.8 V-1.3 V. Additionally, the frequency specifications may vary in a frequency range of about 24 MHz-SDR to 96 MHz-DDR.

In an exemplary scenario, the data path 106 may form a part of the SoC that operates in response to a clock signal, such as, for example, a clock signal provided by a clock data path 108. The plurality of interface components 104 are coupled with the IC by utilizing the data path 106 and clock data path 108. For example, the IC includes a data I/O unit 110 and a clock I/O unit 112 for coupling the respective ports of one or more interface components with that of the IC. Such coupling is done based on customer specifications. For example, the SDR cards and the DDR cards can be coupled with an MMC port of the IC in order to provide varying specifications as per user needs. However, in order to provide such varied specifications, there is a single controller/data path within the SoC for coupling the IC with, or connecting the IC to, the variety of external components. For example, at least one hold buffer 114 may be provided on the data path 106 for fixing hold for the SDR mode, and to thereby setup a violation for the DDR mode. Accordingly, the timing specifications for various options of external components may be different. For example, the DDR mode of a MMC is set-up critical, while the timing specifications for the SDR mode of a MMC is based on hold timings. In an example, the half cycle mode of multichannel buffered serial port (McBSP) is setup critical while the full cycle mode of McBSP is hold critical. The term 'set-up' as used herein may be construed as, for example, a minimum amount of time that may elapse before the clock's active edge during which the data will be stable for performing latching correctly. Also, the term 'hold' as used herein may be construed as, for example, a minimum amount of time after the clock's active edge during which data may be stable. In an SOC-design, may be important to apply correct and appropriate timing specifications to the design. Incorrect timing specifications may lead to on-chip failures that could possibly be undesirable. Appropriate and exhaustive timing specifications enhance area recovery and chip utilization.

Various embodiments of the present disclosure provide solutions for optimizing specifications, such as timing specifications associated with various design applications in a SoC that overcome various performance obstacles, in addition to providing currently unavailable benefits. For instance, various embodiments provide solutions for configuring data paths for different device options associated with the conflicting timing specifications of various interface components. In an exemplary embodiment, a circuit is provided that may be configured to provide a plurality of data paths such that the data paths may be programmable as per a customer's specifications, and, therefore, the circuit helps to meet conflicting timing specifications for various device options/modes simultaneously. For example, the circuit allows for the configuration of modes, such as the DDR mode and the SDR mode, in a device by segregating data paths in order to enable the modes simultaneously. In various embodiments, the segregation of data paths may be achieved by providing a programmable control circuit that may be programmed by the customer as per the specifications of the respective modes. Various embodiments of the present disclosure are further described herein with reference to FIGS. 2 to 4.

Figure 2:
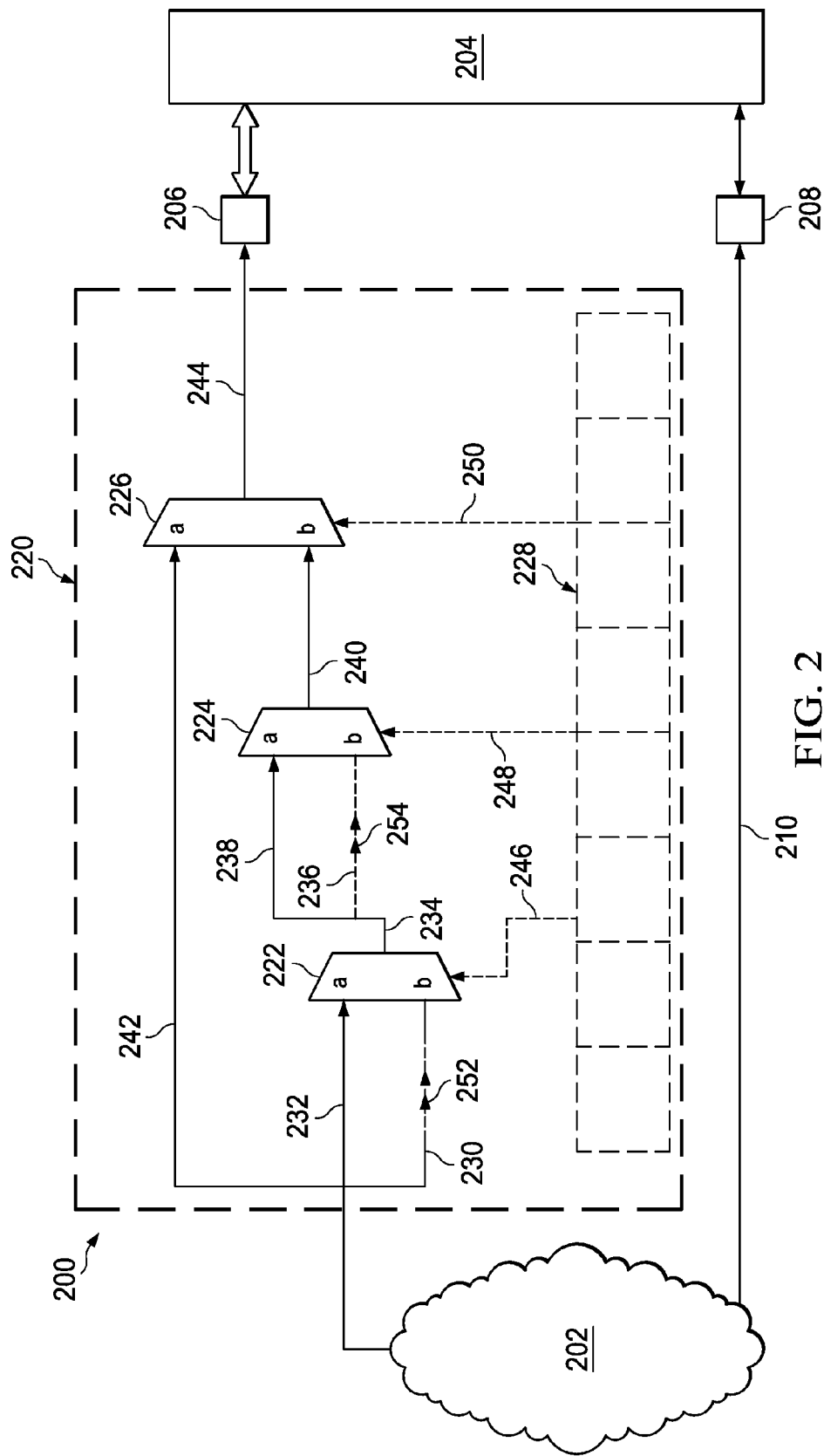
FIG. 2 illustrates a system implementing a circuit configured to enable specifications support of a plurality of interface components in an IC in accordance with an embodiment.

FIG. 2 illustrates a system 200 implementing a circuit 220 that is capable of enabling specifications support of a plurality of interface components in an IC in accordance with an embodiment. The circuit 220 is configured to act as an interface between a logic unit, such as, for example, a logic unit 202 and a plurality of interface components 204. It is noted that, in an embodiment, the logic unit 202 and the plurality of interface components 204 explained herein with respect to FIG. 2 are similar in configuration and functionality to the logic unit 102 and the plurality of interface components 104, respectively, explained herein with respect to FIG. 1. Accordingly, the description of the logic unit 202 and the plurality of interface components 204 are omitted herein for the sake of brevity. Additionally, the system 200 includes an I/O data unit 206 and a clock unit 208 that are similar in configuration and functionality to the I/O data unit 110 and the clock unit 112, respectively, and, accordingly, the description thereof is omitted herein for the sake of brevity.

The interface circuit 220 is configured to provide a simple and flexible arrangement that can meet a wide variety of device options that may be implemented to connect various devices with conflicting timing specifications. For example, the circuit 220 may be configured to provide support for various system modes, such as 64 MHz SDR performance and 48 MHz DDR performance, simultaneously. In one exemplary scenario, the interface circuit is configured to provide timing specifications of various system modes, such as a McBSP, a display, and the like.

In an embodiment, the interface circuit 220 provides segregated data paths for meeting conflicting timing specifications associated with various device options. In an embodiment, the interface circuit 220 is configured to provide segregated data paths and an output based on timing specifications associated with the device options. In an embodiment, the output may be provided on a plurality of data paths that may form a part of the SoC, and the plurality of data paths operates in response to a clock signal, such as, for example, a clock signal provided by a clock path 210.

In an embodiment, the interface circuit, such as, for example, the circuit 220, includes a plurality of multiplexer circuits, such as, for example, multiplexer circuits 222, 224, 226, and a control circuit 228 is coupled with the plurality of multiplexer circuits. The plurality of multiplexer circuits are arranged sequentially and configured to receive a pair of inputs through a pair of data paths. For example, the multiplexer circuit 222 receives a pair of inputs 230, 232 and generates an output 234, the multiplexer circuit 224 receives a pair of inputs 236, 238 and generates an output 240, the multiplexer circuit 226 receives a pair of inputs 240, 242 and generates an output 244, and so on. In various embodiments, a selection of one of the pair of input paths is performed based on a selection signal, such as, for example, a selection signal provided to the respective multiplexer. In an embodiment, a set of selection signals may be provided to the plurality of multiplexer circuits in order to generate an output. For example, the set of selection signals, such as selection signals 246, 248, 250 may be provided as inputs to the plurality of multiplexer circuits 222, 224, 226, respectively, to thereby select one data path from among the pair of data paths that lead to the respective multiplexer circuits. In an embodiment, the output of the multiplexer circuits is indicative of a selection of a mode of operation of the circuit 220 that enables at least one device option from among a variety of device options to be achieved or selected.

As illustrated in FIG. 2, the plurality of multiplexer circuits, including the multiplexer circuits 222, 224, and 226, are arranged in a sequential manner such that an output of a preceding multiplexer circuit is provided to a succeeding multiplexer circuit in a sequence of multiplexer circuits. For example, the output of the multiplexer circuit 222 is provided as an input to the succeeding multiplexer circuit 224, the output of a preceding multiplexer circuit 224 is provided as an input to the succeeding multiplexer circuit 226, and so on. In an embodiment, the plurality of multiplexer circuits are configured to provide a plurality of data paths, wherein the plurality of data paths are configured to provide at least a first mode of operation and a second mode of operation based on the set of selection signals. In an embodiment, the first mode of operation and the second mode of operation are associated with complimentary specifications. In an exemplary embodiment, the first mode of operation and the second mode of operation may be associated with a DDR mode and a SDR mode, respectively. In one exemplary embodiment, the first mode of operation and the second mode of operation may be associated with a complimentary voltage range and/or frequency range of the DDR mode and the SDR mode. It is noted that the disclosure is explained herein with respect to the memory operation modes, such as a DDR mode and a SDR mode; however, the present embodiment is applicable for various other applications/device options, such as a display, a McBSP, and the like.

In an embodiment, based on customer specifications and device options, the data path may be applied at a DDR or a SDR. In an exemplary embodiment, for a DDR mode of operation, the data path 232 between the MMC and the multiplexer circuit 232 may be applied, while for the SDR mode of operation and the data path 230 between the MMC and the multiplexer circuit 222 may be applied. As can be seen, various embodiments of the present disclosure provide segregated paths for different modes of operation associated with conflicting timing specifications, such as the SDR mode and the DDR mode. In an embodiment, a first data path (for example, the data path 230) from among the pair of data paths (for example, the pair of data paths 230, 232) comprises a plurality of delay elements/hold buffers (for example, the delay elements 252) for generating a delay signal in the first data path 230. Also, the first data path 236 from among the pair of data paths 236, 238 comprises a plurality of delay elements/hold buffers such as delay elements 252 254 for generating a delay signal in the data path 236. The delay signal in the first data path is configured to prevent an occurrence of a second mode of operation associated with the second data path. For example, the timing for the DDR mode and the half cycle mode is setup critical while the timing for the SDR mode and the full cycle mode is hold critical. Accordingly, the provisioning of delay elements/hold buffers in the first data path associated with the SDR mode may facilitate in delaying the occurrence of the SDR mode. As disclosed herein, the provisioning of the segregated data paths has the advantage whereby the timing specifications for these device options, such as the SDR mode and the DDR mode, can be met simultaneously on the same IC without a need of any additional hardware.

In various embodiments, a number of paths between the sequentially arranged multiplexer circuits can be utilized to realize various modes of operation/device options. In addition, the timing closure may be accomplished on the respective data path. For example, the data paths 230 and 232 are utilized to select one of the SDR mode and the DDR mode of operation. As is illustrated in FIG. 2, for the timing closure of the SDR mode, the hold closure can be accomplished behind the 'b' pin of the multiplexer circuit 222, while for the DDR mode, the 'a' pin of the multiplexer circuit 222 can be utilized. Further, one of the data paths 230 and 232 can be utilized to select between the voltage ranges of the mode of operation (SDR or DDR) selected by the multiplexer circuit 222. Furthermore, one of the data paths, namely 238 and 236, can be selected for performing selective time closure/adjustment between 1.8V and 3.3 V.

In an embodiment, the selection of one of the modes (for example, from among the first mode and the second mode) may be performed by the control unit 228. The control unit 228 is coupled with the plurality of multiplexer circuits 222, 224 and 226 in order to control the set of selection signals input to the plurality of multiplexer circuits. For example, the control unit 228 controls the selection signals 246, 248 and 250 that may be input to the plurality of multiplexer circuits, such as, for example, the multiplexer circuits 246, 248 and 250, respectively, to thereby select one of the data paths input to the respective multiplexer circuits. In an embodiment, the control unit 228 includes a register circuit for storing multi-bit data corresponding to one of the first mode of operation and the second mode of operation. In an exemplary embodiment, the register circuit may be programmed to store multi-bit values based on device options that are selectable by a user. In an embodiment, the programming of the register circuit for storing multi-bit values may be performed by a user, such as, for example, a customer.

Figure 3:
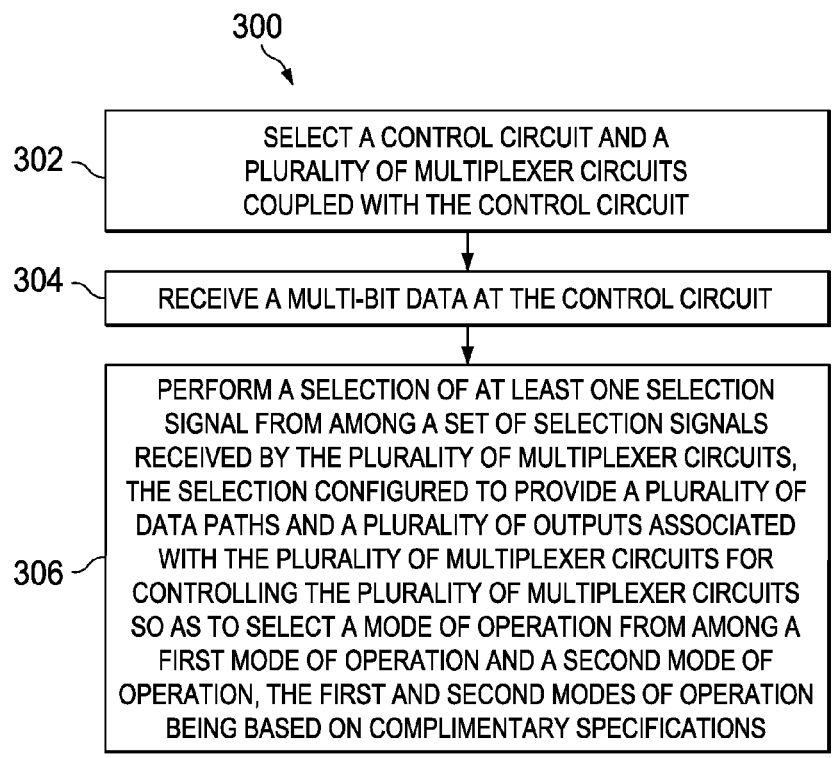
FIG. 3 illustrates a flow diagram of an exemplary method of enabling specifications support of a plurality of interface components in an IC in accordance with an embodiment.

FIG. 3 illustrates a flow diagram of an exemplary method of enabling specifications support of a plurality of interface components in an IC in accordance with an embodiment. The method 300 includes providing programmable segregated paths for incorporating a plurality of device options associated with conflicting timing specifications. In certain embodiments, operations of method 300 are performed by a circuit, such as, for example, the circuit 200 (see, e.g., FIG. 2), configured to interface a logic unit with the plurality of interface components according to various device options.

At block 302, the method includes selecting a control circuit and a plurality of multiplexer circuits coupled with the control circuit. In an embodiment, an example of the control circuit is the control circuit 228, and an example of the plurality of multiplexer circuits is the plurality of multiplexer circuits 222, 224, 226, associated with the circuit 200 (described with reference to FIG. 2).

At block 304, the method 300 includes receiving multi-bit data at a control unit, such as, for example, the control unit 228 that is associated with an interface circuit, such as, for example, the interface circuit 220. In an embodiment, the multi-bit data is indicative of a selection performed by the set of selection signals that are input to a plurality of multiplexer circuits coupled with the control unit, such as, for example, the control unit 228. In an exemplary embodiment, the control unit 228 includes a register circuit configured to store multi-bit data corresponding to one of the first mode of operation and the second mode of operation. In an exemplary embodiment, the register circuit may be programmed to store multi-bit values as per a device option selected by a user. For example, the multi-bit values associated with configuring the device for the SDR mode are different than the multi-bit values associated with configuring the device for the DDR mode. In an embodiment, programming the register circuit to store multi-bit values may be performed by a user, such as, for example, a customer.

At block 306, the method 300 includes performing a selection of at least one selection signal from among the set of selection signals input to the plurality of multiplexer circuits based on the multi-bit data so as to enable a plurality of data paths provided between the plurality of multiplexer circuits. In an embodiment, the selection of the at least one selection signal of the sequence of selection signals generates an output of the interface circuit in order to configure one of a first mode of operation and a second mode of operation. In an embodiment, the first mode of operation and the second mode of operation are associated with conflicting/complimentary specifications, such as, for example, timing specifications. An example of the first mode of operation may include a SDR mode, and the corresponding second mode of operation may include a DDR mode, and vice-versa. One example of the first mode of operation may include a 64 MHz SDR mode while the second mode of operation may include 48 MHz DDR mode. In various exemplary embodiments, the first mode of operation and the second mode of operation may be achieved based on various device options, including, for example, voltage options, frequency options, and the like.

In an embodiment, the first mode of operation and the second mode of operation associated with conflicting timing specifications are provided by segregating data paths between the plurality of multiplexer circuits such that the first mode of operation and the second mode of operation are enabled on distinct data paths. In an exemplary embodiment, a delay signal may be provided in one data path from among the pair of data paths that are input to the multiplexer circuit in order to prevent a selection of one of the pair of modes of operation and enabling another one. For example, a delay signal may be provided in one of the pair of data paths in order to enable the first mode of operation and holding/preventing an occurrence of the second mode of operation. A block diagram of an IC configured to enable specifications support of a plurality of interface components in an IC is described herein with reference to FIG. 4.

Figure 4:
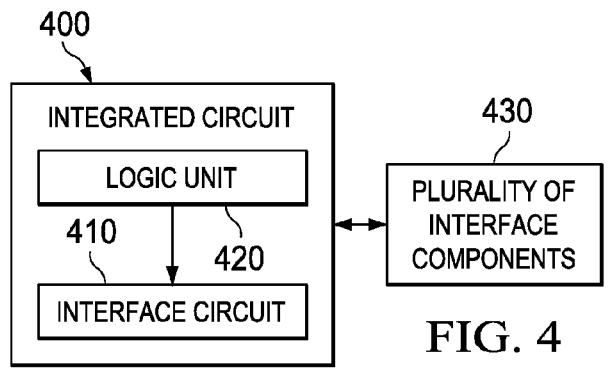
FIG. 4 illustrates a block diagram of an exemplary IC configured to enable specifications support of a plurality of interface components in the IC in accordance with an embodiment.

FIG. 4 illustrates a block diagram of an IC configured to enable specifications support of a plurality of interface components in an IC in accordance with an embodiment. In an embodiment, the specifications, such as timing specifications disclosed herein, may be conflicting timing specifications, such as discussed herein with reference to FIGS. 1-3. In an embodiment, the conflicting timing specifications associated with various modes of operation/device options can be met by providing an interface circuit between a plurality of components (for example, a plurality of interface components 204) associated with a plurality of electronic interfaces and a logic unit (for example, a logic unit 202) configured to perform logic operations associated with the plurality of interface components 204. The interface circuit 220 (explained herein with reference to FIG. 2) may be implemented as an interface circuit 410 in the IC 400. The interface circuit 410 is configured to provide a plurality of data paths in order to enable one of the modes of operation based on customer specifications or device options.

The interface circuit 410 is coupled with or connected to the logic unit 420. The interface circuit 410 may further be coupled with or connected to a plurality of interface components 430. In an embodiment, the plurality of components includes, but is not limited to, a processor, a memory input/output (I/O) circuitry, and peripheral devices, such as a display, communicatively coupled with one another through a system bus. In an embodiment, the plurality of components (such as a MMC and display) or the device options may be configured to be connected with various off-the-shelf components on the customer IC. Moreover, the MMC may be required to be connected to a range of eMMC and SD cards. In various applications, the voltages for the external MMC cards vary from 1.8 V-3.3 V, while the frequency parameter varies from 24 MHz-SDR to 96 MHz DDR. Accordingly, the timing specifications for various device options may be different and conflicting, and such specifications can be met by providing the interface circuit 410 with a plurality of data paths that are segregated according to such specifications.

It is noted that the interface circuit 410 may be an example of the circuit 220, and, accordingly, various components of the interface circuit 410 are similar in functionality to the corresponding components of the interface circuit 200. In one embodiment, the logic functions of the circuit 410 are supported by a programmable core of the electronic device 400. The description of various corresponding components of the interface circuit 410 is explained herein with reference to FIGS. 2 through 4, and the description thereof is omitted herein for the sake of brevity.

Without in any way limiting the scope, interpretation, or application of the claims appearing below, advantages of one or more of the exemplary embodiments disclosed herein include providing an interface circuit between a logic unit and a plurality of interface components associated with conflicting timing specifications. Various embodiments of the present technology enable the meeting of various device options associated with conflicting timing specifications simultaneously. Various embodiments of the present technology provide an interface circuit comprising a plurality of data paths that may be segregated in order to facilitate various modes/device options associated with conflicting timing specifications. Additionally, in some embodiments, the interface circuit comprises a control circuit that may receive a multi-bit value and, in response, generate a selection signal that enables a desired mode associated with a device option. An advantage of the present solution is that the interface circuit is that the amount of time that is to be utilized for implementing and validating the present solution is greatly reduced.

It should be noted that reference throughout this specification to features, advantages, or similar language does not imply that all of the features and advantages should be, or are in, any single embodiment. Rather, language referring to the features and advantages is understood to mean that a specific feature, advantage, or characteristic described in connection with an embodiment is included in at least one embodiment of the present technology. Thus, discussions of the features and advantages, and similar language, throughout this specification may, but do not necessarily, refer to the same embodiment.

Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions are apparent and well within the spirit and scope of the technology. Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. An integrated circuit comprising:
   A. a logic unit having a logic data output lead and a clock output lead;
   B. a data input and output unit having data input and output leads;
   C. a clock input and output unit having a clock input lead coupled to the clock output lead of the logic unit and a clock output lead; and
   D. an interface circuit having an interface data input lead coupled to the logic data output lead, the interface circuit being free of any connection to the clock lead of the logic unit and the clock input and output unit, the interface circuit including:
      i. first multiplexer circuitry having a first input coupled to the interface data input lead, a second input coupled to the interface data input lead, a control input, and a first multiplexer output;
      ii. second multiplexer circuitry having a first input coupled to the first multiplexer output, a second input coupled to the first multiplexer output, a control input, and a second multiplexer output; and
      iii. third multiplexer circuitry having a first input coupled to the interface data input lead, a second input coupled to the second multiplexer output, a control input, and a third multiplexer output coupled to a data input lead of the data input and output unit;
      iv. first delay circuitry coupled between the interface data input lead and the second input of the first multiplexer circuitry; and
      v. second delay circuitry coupled between the first multiplexer output and the second input of the second multiplexer circuitry.

2. The integrated circuit of claim 1 in which the interface circuitry includes a control circuit having control outputs connected to the control inputs of the multiplexers.

* * * * *